(12) United States Patent
Yamada

(10) Patent No.: US 7,083,846 B2
(45) Date of Patent: Aug. 1, 2006

(54) CERAMIC MEMBER

(75) Inventor: Hirotake Yamada, Anjo (JP)

(73) Assignee: NGK Insulators, Ltd., Nagoya (JP)

( * ) Notice: Subject to any disclaimer, the term of this patent is extended or adjusted under 35 U.S.C. 154(b) by 93 days.

(21) Appl. No.: 10/796,799

(22) Filed: Mar. 9, 2004

(65) Prior Publication Data

US 2004/0234824 A1 Nov. 25, 2004

(30) Foreign Application Priority Data

Mar. 14, 2003 (JP) .......................... P2003-069831

(51) Int. Cl.
*B32B 3/00* (2006.01)
(52) U.S. Cl. ...................... 428/210; 428/201; 428/213; 428/215; 428/220; 428/908.8; 428/696; 428/697; 428/701; 428/702; 428/699; 118/723 R
(58) Field of Classification Search ................ 428/201, 428/210, 213, 215, 220, 908.8, 696–697, 428/699, 701–702
See application file for complete search history.

(56) References Cited

FOREIGN PATENT DOCUMENTS

JP    2001-044179 A1    2/2001

*Primary Examiner*—Ling Xu
(74) *Attorney, Agent, or Firm*—Burr & Brown

(57) ABSTRACT

A ceramic member, which is usable in a state where at least a part thereof is exposed in a reactor in which halogen plasma is generated, includes a base member containing a first ceramic material, and a coating layer on a surface of the base member containing a second ceramic material more resistant to plasma etching than the first ceramic material. Further, the ceramic member includes a thick portion in a region where an etching rate of the coating layer by the halogen plasma is locally high, and a thickness (tt) of the thick portion and a thickness (tn) of a normal thickness portion other than the thick portion satisfy the following expression (1):

$$tn < tt \leq (Ee/En) \times tn \qquad (1)$$

where
  En: etching rate of the coating layer in the normal thickness portion; and
  Ee: etching rate of the coating layer in the thick portion.

19 Claims, 4 Drawing Sheets

CERAMIC MEMBER

CROSS REFERENCE TO RELATED APPLICATION

This application is based upon and claims the benefit of priority from prior Japanese Patent Application No. 2003-69831, filed on Mar. 14, 2003; the entire contents of which are incorporated herein by reference.

BACKGROUND OF THE INVENTION

1. Field of the Invention

The present invention relates to a member used in semiconductor manufacturing apparatus, and particularly, to a ceramic member used in a reactor where halogen plasma is generated.

2. Description of the Related Art

Plasma treatment apparatus used for the purpose of manufacturing a semiconductor, such as plasma CVD apparatus and plasma etching apparatus, has a hermetically sealable reactor capable of maintaining a low-pressure/vacuum condition. Reaction gas is introduced into the reactor, and by a plasma reaction thereof, a thin film is deposited on a wafer, or the thin film is etched. As this reaction gas, highly corrosive halogen-based gas is utilized in many cases.

For example, in film-depositing apparatus, halogen gas such as $TiCl_4$, $MoCl_4$ and $WF_6$ is used for depositing a thin film for metal wiring. Further, in plasma etching apparatus, halogen gas such as $CF_4$, $CCl_4$, HF, $ClF_3$, $Cl_2$ and $BCl_2$ is used for etching a Si film and insulating films.

Accordingly, it is necessary that a member used in the reactor, for example, a chamber inner wall composing a wall of the reactor, a variety of ring members located on the periphery of a substrate stage, and the like, include sufficient corrosion resistances to halogen plasma of such halogen gas.

For example, as a material of the chamber inner wall conventionally used in the plasma treatment apparatus, an alumina sintered body including the corrosion resistance to the halogen plasma, from which a large sintered body is able to be prepared relatively easily, has been employed.

However, in the conventionally employed member using the alumina sintered body, etching by the halogen plasma cannot be prevented completely, and with an increase in the number of usages, a surface of the member is corroded by the etching, and accordingly, it becomes necessary to exchange the member. Moreover, the etched alumina becomes an impurity when being mixed into a semiconductor device, thus becoming a factor to inhibit performance of the device. Therefore, in order to lower maintenance costs by reducing an exchange frequency of the member and to prevent the impurity from being mixed into the semiconductor device, it has been required to use a ceramic member having a higher corrosion resistance to the halogen plasma.

Meanwhile, as such a material having a high corrosion resistance to the halogen plasma, for example, YAG ($Y_3Al_5O_{12}$) is given. However, it is difficult to form such a large-sized sintered member of YAG as that of alumina. Therefore, recently, studies have been started on the use of a member improved in corrosion resistance, in which a surface of a base member composed of the alumina sintered body is coated with a YAG coating layer of an even thickness. A longer lifetime of the member can be expected as the YAG coating layer is thickened.

However, in general, the material resistant to the halogen plasma, such as YAG, has low toughness and low mechanical strength. Thus, a crack is often occurred when the coating layer is thick. Therefore, it is difficult to form such a thick coating layer without cracks. Accordingly, there are limitations on extending the lifetime of the member using the conventional YAG coating layer.

SUMMARY OF THE INVENTION

It is an object of the present invention to further extend a lifetime of a ceramic member having a surface exposed in a reactor where halogen plasma is generated.

A ceramic member according to a second aspect of the present invention is a ceramic member being usable in a state where at least a part thereof is exposed in a reactor in which halogen plasma is generated. The ceramic member includes a base member containing a first ceramic material as a main component, and a coating layer on a surface of the base member. The surface of the base member faces an inside of the reactor. The coating layer contains, as a main component, a second ceramic material more resistant to plasma etching than the first ceramic material. Further, the ceramic member includes a thick portion in a region where an etching rate of the coating layer by the halogen plasma is locally high, and a thickness (tt) of the thick portion and a thickness (tn) of a normal thickness portion other than the thick portion satisfy the following expression (2):

$$tn < tt \leq 3 \times tn \qquad (2).$$

where
En: etching rate of the coating layer in the normal thickness portion; and
Ee: etching rate of the coating layer in the thick portion.

A ceramic member according to a second aspect of the present invention is a ceramic member is usable in a state where at least a part thereof is exposed in a reactor in which halogen plasma is generated. The ceramic member includes a base member containing a first ceramic material as a main component, and a coating layer on a surface of the base member. The surface of the base member faces an inside of the reactor. The coating layer contains, as a main component, a second ceramic material more resistant to plasma etching than the first ceramic material. Further, the ceramic member includes a thick portion in a region where an etching rate of the coating layer by the halogen plasma is locally high, and a thickness (tt) of the thick portion and a thickness (tn) of a normal thickness portion other than the thick portion satisfy the following expression (2):

$$tn < tt \leq 3 \times tn \qquad (2).$$

In accordance with the ceramic member according to the first or second aspect of the present invention, the thick portion of the coating layer is locally formed on a portion where the etching rate by the halogen plasma is fast. Accordingly, a stress that will occur can be controlled in scale as compared with the case of coating the entire surface of the base member with a thick coating layer, and a crack can be prevented from occurring. Hence, the thick coating layer can be locally formed. Moreover, the thickness (tt) of the thick portion is made larger than the thickness (tn) of the normal thickness portion, and thus the lifetime of the ceramic part is extended as compared with the case of setting the thickness of the coating layer at such an even thickness (tn). Furthermore, the thickness (tt) is set at $((Ee/En) \times tn)$ or less, or at $(3 \times tn)$ or less, and thus an adjustment is made such that the lifetime of the coating layer is determined in rate by the thickness of the layer, and the crack that may occur by thickening the thick portion to an unnecessary extent can be prevented from occurring.

DETAILED DESCRIPTION OF THE EMBODIMENTS

Figure 1A:
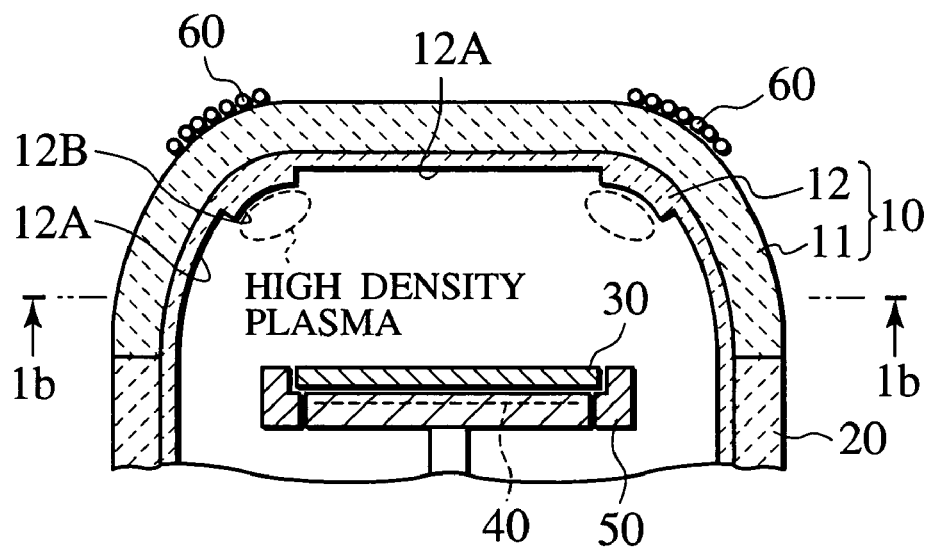
FIG. 1A is a schematic cross-sectional view of apparatus, showing an example of various ceramic members used in plasma etching apparatus according to an embodiment of the present invention.
Figure 1B:
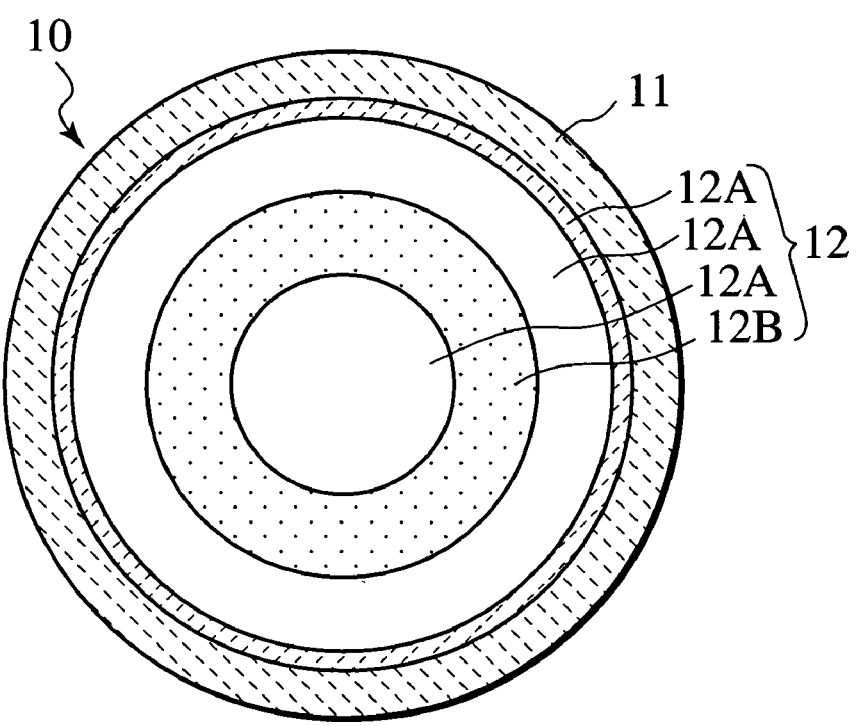
FIG. 1B is a cross-sectional view of a chamber inner wall, showing a configuration of an inner wall surface of a dome-shaped chamber inner wall according to the embodiment of the present invention.
Figure 2:
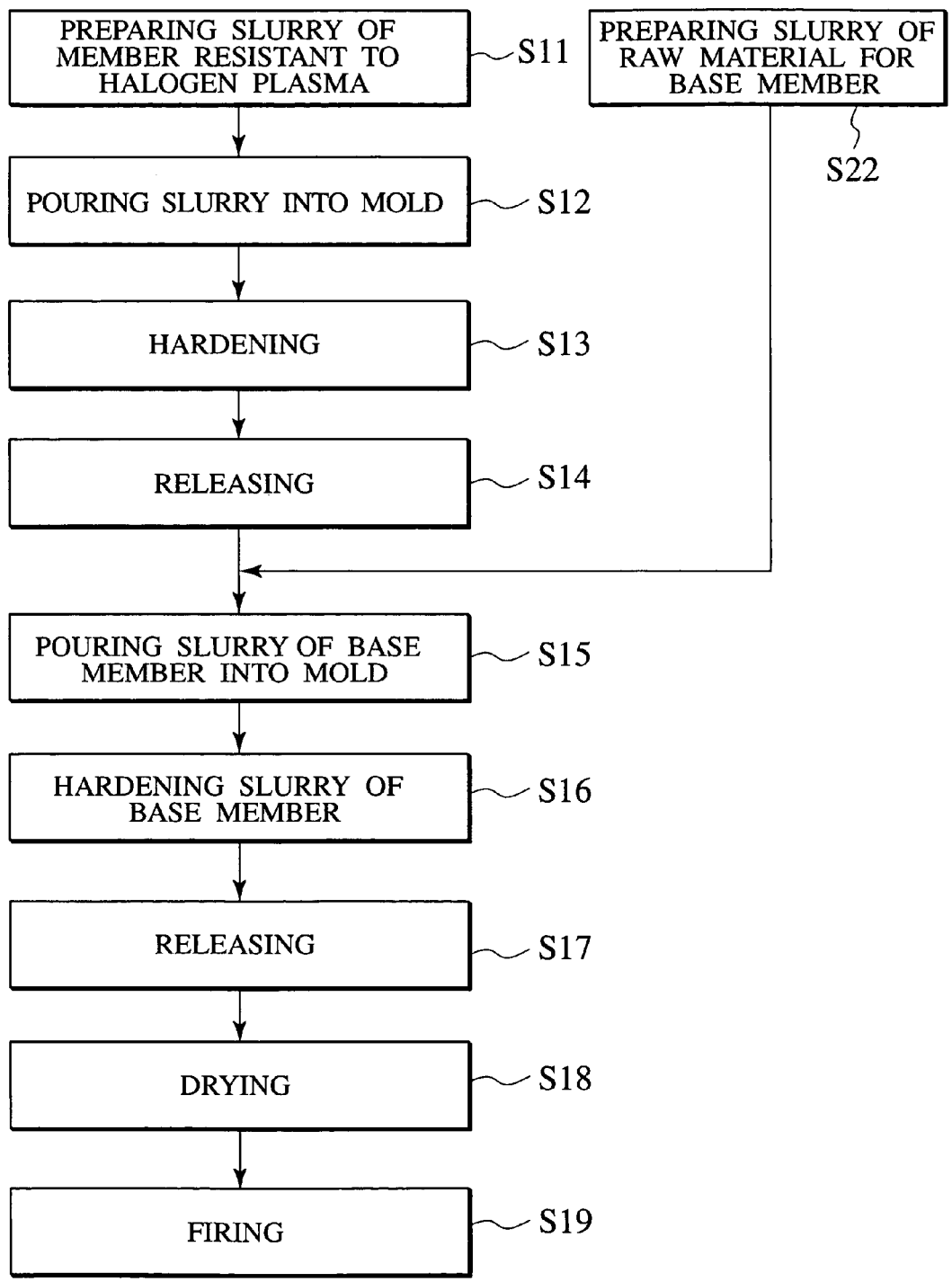
FIG. 2 is a flowchart showing a method for manufacturing the chamber inner wall by use of a gel casting method, according to the embodiment of the present invention.

FIGS. 1A and 1B are cross-sectional views showing partial structures of the reactor of the plasma etching apparatus. The reactor, which is hermetically sealable, is composed of a cylindrical chamber inner wall 20 and a dome-shaped chamber inner wall 10 provided thereon. On an outer circumference of the dome-shaped chamber inner wall 10, an electrode (high-frequency coil) 60 for generating the plasma is disposed.

On a lower side in the center in the reactor, a substrate 30 is fixed onto an electrostatic chuck 40. On the periphery of the electrostatic chuck 40, a circular ring member 50 is disposed for protecting sidewalls of the electrostatic chuck 40 and substrate 30 from plasma damage and corrosion gas. Note That a substrate heater or a susceptor is used in many cases instead of the electrostatic chuck 40. Moreover, the ring member 50 maybe comprised not of a single member but of a plurality of members. Any of the chamber inner walls 10 and 20 and the ring member 50 corresponds to the ceramic member used in the state where at least a part thereof is exposed in the reactor where the halogen plasma is generated.

Types of the members according to this embodiment of the present invention are not particularly limited. However, here, the chamber inner wall 10 of the reactor used in the plasma etching apparatus is given as an example, and features thereof will be described.

As shown in FIG. 1A, the chamber inner wall 10 according to this embodiment includes a base member 11 formed of a first ceramic material, and a coating layer 12 coating this base member 11. The coating layer 12 is formed of a second ceramic material having a higher corrosion resistance to the halogen plasma than the first ceramic material forming the base member 11. A main feature of the chamber inner wall 10 according to this embodiment is that the thickness of the coating layer 12 is not even but a thick portion 12B having a thick layer is formed locally on a portion where the damage due to the halogen plasma is large.

In the plasma etching apparatus shown in FIG. 1A, in the case of generating the plasma, high density plasma is prone to occur particularly in a region in the reactor, which is close to the electrode 60 provided on the periphery of an outer wall of the chamber inner wall 10. Hence, a surface of the chamber inner wall 10 at a position where the electrode 60 is disposed, the surface being exposed in the reactor, is the most prone to suffer the halogen plasma damage due to this high density plasma. Specifically, an etching rate of the coating layer 12 formed on this portion is faster than an etching rate of the coating layer 12 formed on the other portion. The coating layer 12 of the chamber inner wall 10 according to this embodiment has the thick portion 12B provided locally on this portion where the etching rate is faster.

FIG. 1B is a cross-sectional view of the chamber inner wall 10 from a viewpoint looking upward from a line 1b—1b of FIG. 1A. A cross section of the dome-shaped chamber inner wall 10 has a substantially circular outer shape, and on a circumferential portion corresponding to a region where the coil-shaped electrode 60 is disposed, the thick portion 12B is formed at least wider in width than the width in which the electrode is disposed.

In the chamber inner wall 10 according to this embodiment, as described above, the thick portion 12B of the coating layer 12 is provided in the region where the etching rate by the halogen plasma is fast. Accordingly, it is made possible to achieve extension of a lifetime of the chamber inner wall 10.

Concretely, as a material of the base member 11 of the chamber inner wall 10, alumina, silicon nitride, aluminum nitride, silicon carbide and the like are usable. Moreover, in the case of using alumina as the material of the base member 11, it is preferable to use yttria or a composite oxide of yttria and alumina, for example, YAG, which has higher resistance to the halogen plasma than alumina, as a material of the coating layer 12. Moreover, in the case of using silicon nitride, aluminum nitride or silicon carbide as the base member 11, a diamond (C) film is usable as the coating layer 12. Furthermore, in the case of using silicon nitride, aluminum nitride or silicon carbide as the base member 11, alkaline-earth fluoride is also usable as the material of the coating layer 12. As alkaline-earth fluoride, concretely, magnesium fluoride, calcium fluoride, barium fluoride and the like can be given as examples.

The ceramic materials resistant to the halogen plasma, such as YAG and diamond, which form the coating layer 12, are expensive materials in general, and in addition, have low toughness and mechanical strength. Therefore, when a thick layer of the coating layer 12 is prepared over the entire surface of the base member 11, a material cost becomes high, and resulting from a difference between the a base member 11 and the coating layer 12 in thermal expansion coefficient and the like, a crack is prone to occur in preparing the layer. Contrary to this, the chamber inner wall 10 according to this embodiment has the thick portion 12B of the coating layer 12 only on a portion where the plasma damage is high, and accordingly, the material cost can be reduced, and a stress that will occur can be controlled in scale. Therefore, it is made possible to prevent the crack from occurring. Hence, the thicker coating layer can be formed on such a spot requiring the thickening without occurrence of the crack as compared with the case of forming the layer of an even thickness over the entire surface of the base member 11.

Concretely, it is preferable to make an adjustment such that the thickness (tt) of the thick portion 12B and the thickness (tn) of a normal thickness portion other than the thick portion satisfy the following expression (1):

$$tn < tt \leq (Ee/En) \times tn \quad (1)$$

where
- En: etching rate of the coating layer in the normal thickness portion 12A; and
- Ee: etching rate of the coating layer in the thick portion 12B.

On the region where the etching rate by the halogen plasma is high, the thick portion 12B is thicker than the normal thickness portion 12A formed in the region other than the region is formed, thus making it possible to improve the lifetime of the chamber inner wall 10 as compared with the conventional one. On the other hand, when the thickness (tt) of the thick portion 12B exceeds a (Ee/En) time the thickness (tn) of the normal thickness portion 12A, the lifetime of the chamber inner wall 10 is determined in rate by the lifetime of the normal thickness portion 12A, and accordingly, an effect of extending the lifetime, which is brought by providing the thick portion 12B, disappears. Moreover, when the thick portion 12B is thickened to an unnecessary extent, the crack becomes prone to occur, which is not preferable.

Moreover, in the chamber inner wall 10 of the plasma etching apparatus as shown in FIGS. 1A and 1B, (Ee/En) is 3 or less in general. Accordingly, it is preferable to set the thickness (tt) of the thick portion 12B so as to satisfy the following expression (2) with respect to the thickness (tn) of the normal thickness portion 12A:

$$tn < tt \leq 3 \times tn \quad (2)$$

When the chamber inner wall 10 according to this embodiment satisfies the expression (2), the thickness (tt) of the thick portion 12B can be set within a range where such a lifetime extension effect is effective, and the crack that may occur by thickening the thick portion 12B to an unnecessary extent can be prevented from occurring.

In conditions satisfying the expression (1) or (2), it is preferable that the thickness (tt) of the thick portion 12B be 8 mm or less and that the thickness (tn) of the normal thickness portion 12A be 5 mm or less. This is because the crack becomes prone to occur when the thickness (tt) of the thick portion 12B exceeds 8 mm. Moreover, also when the thickness (tn) of the normal thickness portion 12A exceeds 5 mm, the crack becomes prone to occur similarly.

Furthermore, in the conditions satisfying the expression (1) or (2), it is preferable that a surface area of the coating layer 12 be $1 \times 10^6$ mm$^2$ or less and that the thickness (tt) of the thick portion 12B be 1.5 mm or less. As the surface area of the coating layer 12 becomes larger, the stress that will occur due to the difference thereof from the base member 11 in thermal expansion coefficient and the like is increased, and accordingly, the crack becomes more prone to occur. Therefore, when the chamber inner wall 10 is of a relatively large reactor and a surface area of a coating layer thereof is $1 \times 10^6$ mm$^2$ or more, the crack cannot be effectively prevented from occurring unless the thickness of the thick portion 12B is set at 1.5 mm or less. Note that, if the thickness (tt) of the thick portion 12B is 3 mm or less when the surface area of the coating layer 12 is $5 \times 10^5$ mm$^2$ or less, and if the thickness (tt) of the thick portion 12B is 6 mm or less when the surface area of the coating layer 12 is $1 \times 10^5$ mm$^2$ or less, the crack can be effectively prevented from occurring.

Next, two representative methods for manufacturing the chamber inner wall 10 according to this embodiment will be described. Note that, here, the methods will be described by taking the case of using an alumina sintered body as the base member 11 and using a YAG layer as the coating layer 12 as an example.

A first method for manufacturing the chamber inner wall according to this embodiment is a method of forming the coating layer by plasma flame spraying. In this method, first, a sintered body of the base member is prepared. Specifically, sintering aids, a binder, a curing agent and the like we added to alumina powder as the need arises, and varieties of foaming methods such as CIP (Cold Isostatic Pressing), slip casting and gel casting are used, thus the dome-shaped compact shown in FIGS. 1A and 1B is formed. Thereafter, this compact is heated in the atmosphere and subjected to a debinder process, followed by firing at approximately 1500° C. to 1700° C., thus the base member 11 composed of the alumina sintered body and shown in FIGS. 1A and 1B is obtained. Next, YAG is evenly coated on the inner wall surface of the dome-shaped base member 11 by use of the plasma flame spraying. In the plasma flame spraying, for example, YAG plasma obtained by supplying YAG powder into a high-temperature flame containing a mixed gas of hydrogen and argon is sprayed onto the surface of the base member 11. First, a position of the base member 11 or YAG plasma is moved in a two-dimensional direction, and a coating layer is evenly formed over the entire surface of the base member 11. Subsequently, the plasma spraying is performed locally for the inner wall surface, and a thick portion is formed. Thereafter, the inner wall surface is fired at approximately 1500° C. to 1700° C. so as to form the coating layer 12. In the case of forming the coating layer by use of the plasma flame spraying method, a position of the thick portion formed locally can be changed easily, and accordingly, this method can by easily applied to formation of coating layers of chamber inner walls in various shapes.

A second method for manufacturing the chamber inner wall according to this embodiment is a method of forming the base member and the coating layer by use of the gel casting method. This method will be described below with reference to FIG. 2 and FIGS. 3A to 3C.

First, a slurry of a material resistant to the halogen plasma, which serves as a raw material of the coating layer 12, and a slurry serving as a raw material of the base member 11 are prepared individually (S11 and S22). For example, powder of YAG, which serves as raw material powder, a dispersing medium, a binder and a dispersant are mixed by a trommel or the like, and a catalyst accelerating a hardening reaction is added thereto, thus the slurry of the material resistant to the halogen plasma is prepared.

Moreover, a powder of Al$_2$O$_3$, which serves as a raw material powder, a dispersing medium, a binder and a dispersant are mixed by use of a trammel or the like, and a catalyst accelerating a curing reaction is added thereto, thus the slurry of the raw material for the base member is prepared.

Figure 3A:
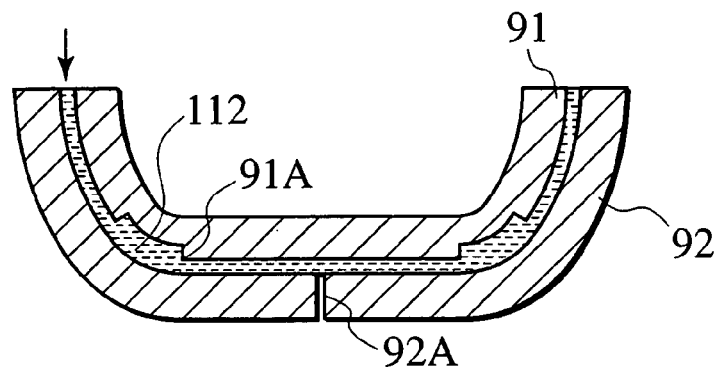
FIGS. 3A to 3C are cross-sectional views of respective steps, showing the method for manufacturing the chamber inner wall by use of the gel casting method, according to the embodiment of the present invention.

Next, as shown in FIG. 3A, the slurry 112 of the material resistant to the halogen plasma is poured into a mold comprised of metal molds 91 and 92 and having a shape of the coating layer 12 (S12). In the metal mold 91, a groove 91A is formed in a region where the thick portion is to be formed.

The slurry 112 injected into the mold starts to harden by a function of the catalyst (S13).

After the slurry of the material resistant to the halogen plasma finishes hardening, the inner metal mold 91 is left as it is, and only the outer metal mold 92 is released (S14).

Figure 3B:
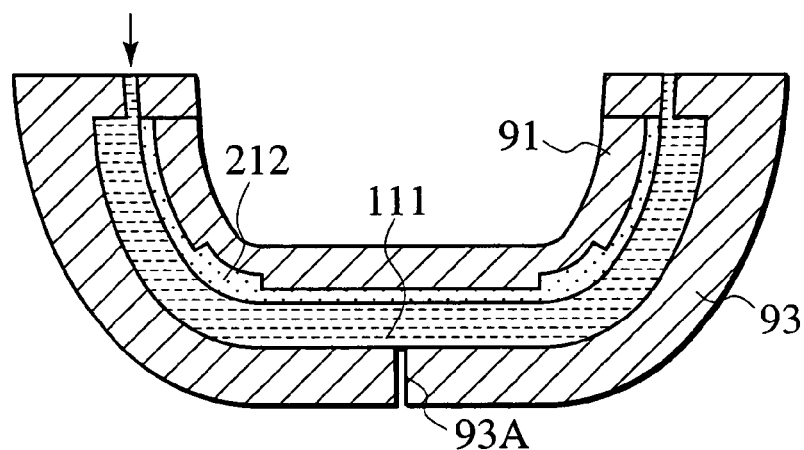

Next, as shown in FIG. 3B, the remaining metal mold 91, a compact 212 containing YAG as a main component, which is obtained by the hardening, and a metal mold 93 are combined, thus making a mold for the base member 10. The slurry 111 of the raw material for the base member is poured into the mold (S15).

The slurry 111 of the raw material for the base member, which is injected into the mold, starts to harden by a function of the catalyst (S16).

Figure 3C:
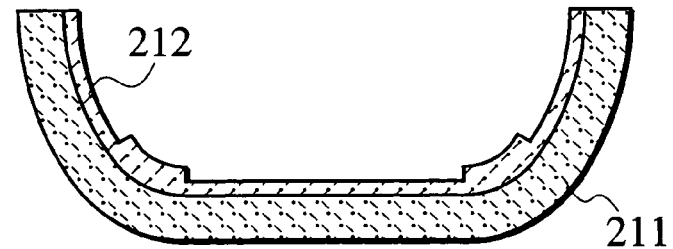

After hardening the slurry for the base member, the metal molds 91 and 93 are released (S17). Thus, as shown in FIG. 3C, an integrally molded article composed of a compact 211 of the base member containing alumina as a main component and a compact 212 of the coating layer containing YAG as a main component is obtained.

Subsequently, the integrally molded article thus obtained is dried, and solvents therein are volatilized (S18). Furthermore, the resultant is subjected to a debinder process, followed by firing, and thus an integrally sintered article is obtained (S19).

When the gel casting method described above is used, errors with respect to design values of the respective dimensions of the base member and coating layer can be reduced because the metal molds are used, and in addition, it is satisfactory that a firing step is performed once because the base member and the coating layer can be integrally fired. Hence, the process can be simplified as compared with the case of the plasma flame spraying method requiring plural times of firing steps.

Note that, though the compact of the coating layer 12 is formed first in the gel casting method, the compact of the base member 11 may be formed first.

Figure 4:
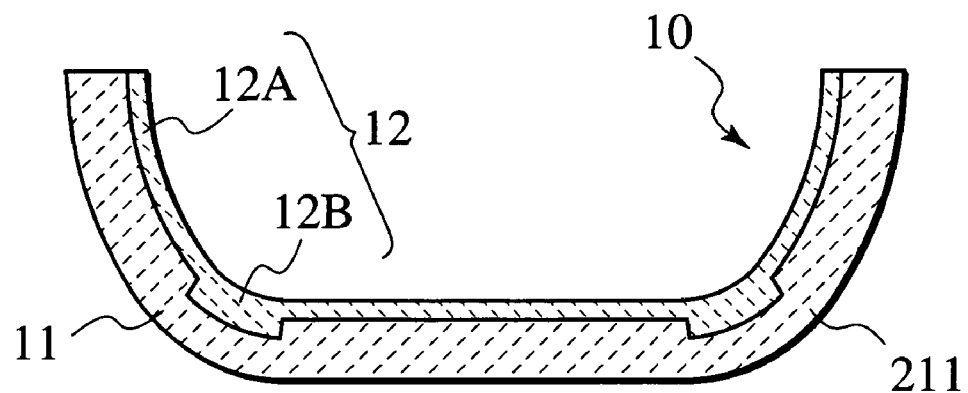
FIG. 4 is a cross-sectional view of apparatus, showing a configuration of a dome-shaped chamber inner wall of another aspect according to the embodiment of the present invention.

FIG. 4 shows another aspect of the chamber inner wall 10 according to this embodiment. Also in the chamber inner wall 10 shown in FIG. 4, the inner wall surface of the base member 11 is coated with the coating layer 12, and the coating layer 12 includes the normal thickness portion 12A and the thick portion 12B. However, as shown in FIG. 4, this inner wall chamber 10 is different from the chamber inner wall 10 shown in FIG. 1 in that the base member 11 has a concave portion and that the thick portion 12B is formed so as to coat this concave portion. Note that, for other conditions, the same conditions as those for the above-mentioned chamber inner wall 10 are usable.

According to the chamber inner wall 10 shown in FIG. 4, the inner wall surface can be made into a substantially smooth surface. Hence, it is possible to prevent variations of a plasma state, which are caused by the existence of a protruding portion on the inner wall surface, the protruding portion being formed by forming the thick portion on the coating layer. Moreover, though there is apprehension that acceleration of the etching by the halogen plasma may occur in the protruding portion, and particularly, in corner portions thereof, such acceleration can be prevented.

Furthermore, when the above-mentioned gel casting method is used, the chamber inner wall in a shape shown in FIG. 4 can be easily prepared only by changing a shape of the metal molds.

As above, this embodiment has been described by taking the chamber inner wall used in the plasma etching apparatus as an example. However, this embodiment is not limited to the plasma etching apparatus, but is also applied to chamber inner walls of varieties of plasma treatment apparatus used in semiconductor manufacturing processes for plasma cleaning, plasma CVD, plasma oxidation and plasma nitriding, and the like.

Moreover, with regard to the shape of the chamber inner wall 10, various shapes can be employed depending on the shape of the semiconductor manufacturing apparatus. Therefore, the shape is not limited to the dome shape as shown in FIG. 1, but may be a cylindrical shape and a rectangular parallelepiped shape.

Furthermore, as long as a member has an exposed surface in a hermetically sealed reactor where plasma is generated, this embodiment can be applied thereto without being limited to the semiconductor manufacturing apparatus. Therefore, this embodiment can also be applied to a translucent ceramic member composing a wall of a hermetically sealed luminous tube of a lamp, which contains a halogen material. The lamp in this case is, for example, a halogen lamp and a metal halide lamp. For example, a base member of the wall of the luminous tube is formed of a transparent alumina sintered body, and a coating layer of YAG is formed on an inner wall surface thereof. Furthermore, a thick portion is formed on the coating layer in a region close to an arc formed in the luminous tube at the time of discharge, thus making it possible to extend a lifetime of the wall of the luminous tube.

EXAMPLES

Studied examples made for realizing effects of the present invention will be described below.

Figure 5:
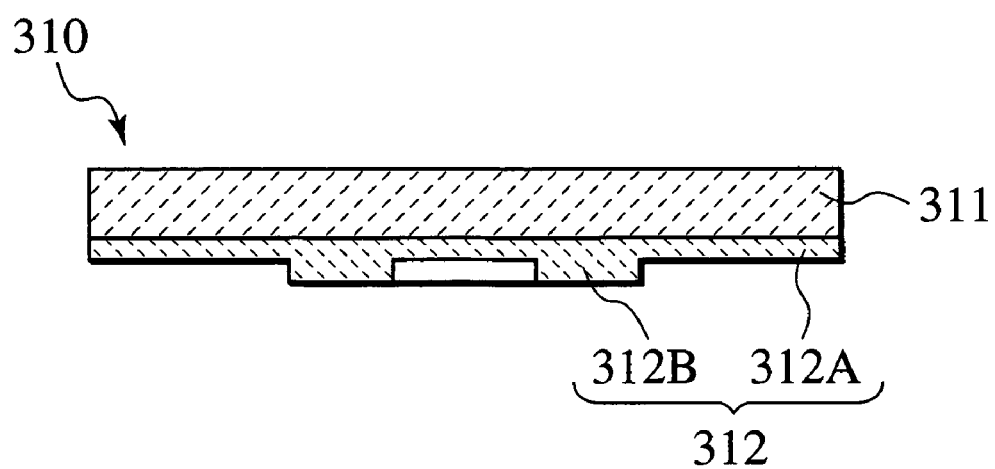
FIG. 5 is a cross-sectional view of apparatus, showing a configuration of a sample of the chamber inner wall according to the embodiment of the present invention.

As shown in FIG. 5, a member sample 310 in which a coating layer 312 composed of a YAG sintered body was formed on one surface of a base member 311 composed of a disc-shaped alumina sintered body with a diameter of 300 mm was prepared under the following conditions. On the coating layer 312, a ring-shaped thick portion 312B with an inner diameter of 100 mm and an outer diameter of 150 mm was formed.

Note that, for an area, thickness of a normal thickness portion 312A and thickness of the thick portion 312B of the coating layer 312, conditions shown in Table 1 were used.

First, 100 parts by weight of YAG powder, 25 parts by weight of dimethyl glutanate that was a dispersing medium, 6 parts by weight of hexamethylene-diisocyanate that was a binder, and 2 parts by weight of copolymer of polymaleic acid that was a dispersant were mixed, and 4.5 parts by weight of triethylamine that was a catalyst was added to the mixture. Thus, the slurry of the material resistant to the halogen plasma, which was for the coating layer, was prepared.

Moreover, 100 parts by weight of $Al_2O_3$, 25 parts by weight of dimethyl glutanate that was the dispersing medium, 6 parts by weight of hexamethylene-diisocyanate that was the binder, and 2 parts by weight of copolymer of polymaleic acid that was the dispersant were mixed, and 4.5 parts by weight of triethylamine that was the catalyst was added to the mixture. Thus, the slurry of the base member was prepared.

Next, as shown in FIG. 3A, the prepared slurry of the material resistant to the halogen plasma for the coating layer was poured into the mold in the shape of the coating layer 12, which was composed of the metal molds 91 and 92, and then hardened. Thereafter, only the outer metal mold 92 was released. As shown in FIG. 3B, the slurry 111 of the raw material for the base member was poured into the mold for the base member 10, which was composed of the remaining metal mold 91, the compact 212 containing YAG as the main component, which was obtained by the hardening, and the metal mold 93, and then hardened. In such a way, the integrally molded article composed of the compact 211 of the base member containing alumina as the main component and the compact 212 of the coating layer containing YAG as the main component was obtained.

Subsequently, the integrally molded article obtained was dried at 200° C. Furthermore, the integrally molded article was subjected to the debinder process, followed by firing at 1650° C., thus the member sample 310 that was the integrally sintered article shown in FIG. 5 was obtained.

The sample was evaluated regarding 1) the existence of an occurrence of the crack in the coating layer after being manufactured, and 2) the lifetime against the halogen plasma.

Specifically, with regard to 1) the existence of an occurrence of the crack, a process of coating red ink on the surface of the coating layer and penetrating the ink into the crack, such that the existence of the crack was highlighted. Then, the existence of the occurrence of the crack was checked by visual observation.

Moreover, 2) the lifetime against the halogen plasma was measured by use of the following conditions. Specifically, the obtained sample 310 was put into a hermetically sealed reactor, an electrode was arranged on a back surface of the base member 311, which corresponded to the region where the thick portion 312B was formed, a bias voltage was applied thereto, and halogen plasma of $Cl_2$ was generated in the reactor. Then, the respective etching rates by the halogen plasma in the thick portion 312B (hereinafter, referred to as "an electrode portion") of the coating layer 312 and the normal thickness portion 312A (hereinafter, referred to as a normal portion) thereof were measured. From results of the measurement, the lifetime against the halogen plasma was evaluated. The inside of the reactor was set at a pressure of 0.1 Torr (1.33×10 Pa), and chlorine gas ($Cl_2$) was introduced thereinto together with argon (Ar) gas that was carrier gas. Flow rates of the Ar gas and $Cl_2$ gas were set at 100 sccm and 300 sccm, respectively. Although the inside of the reactor was not heated from outside by a heater or the like, it seemed that the surface of the sample was heated to several hundred centigrade by receiving heat from the plasma gas. Moreover, the plasma was generated under a condition of 800 W of RF power by applying 310V as a bias voltage. Results are shown in Tables 1 to 4.

<Results>

(Regarding Samples 1 to 9)

Sample 1 is a sample having substantially the same composition as that of the conventional chamber inner wall. A coating layer having an even thickness of 0.2 mm was formed on a base member composed of an alumina sintered body. In a coating layer of an electrode portion, an etching rate was approximately three times that of a coating layer in a region other than the electrode portion (hereinafter, referred to as a "normal portion"), and an overall lifetime of the sample was determined by a lifetime of the coating layer of the electrode portion.

Contrary to this, in Samples 2 to 9, thicknesses (tt) of the coating layers of the electrode portions were individually set at 0.3 mm to 0.9 mm while keeping each thickness (tn) of the coating layer of the normal portion at 0.2 mm. As the thickness (tt) of the thick portion was being increased, the lifetime was extended. However, when the thickness (tt) of the thick portion exceeded three times the thickness (tn) of the normal portion, an extension rate of the lifetime was saturated because the overall lifetime of the coating layer was determined by the thickness (tt) of the normal portion.

From the above results, with regard to the thickness (tn) of the normal portion and the thickness (tt) of the electrode portion, when a ratio of the etching rate (En) of the normal portion and the etching rate (Ee) of the electrode portion is expressed as (En/Ee), it is desirable that the thickness (t) of the electrode portion satisfy the following expression:

$$tn < tt \leq (En/Ee) \times tn$$

(Regarding Samples 10 to 37)

Samples 10 to 13 were prepared such that each thickness (tn) of the normal portions was set at 0.5 mm and that thickness ratios thereof to the thicknesses (tt) of the electrode portions were set in a range of 1.5 to 3. Samples 14 to 17 were prepared such that each thickness (tn) of the normal portions was set at 1 mm and that thickness ratios thereof to the thicknesses (tt) of the electrode portions were set in a range of 1.5 to 3. Samples 18 to 21 were prepared such that each thickness (tn) of the normal portions was set at 2 mm and that thickness ratios thereof to the thicknesses (tt) of the electrode portions were set in a range of 1.5 to 3. In any of the samples, the occurrence of a crack was not observed, and the lifetime thereof was able to be extended as compared with Sample 1.

Samples 22 to 25 were prepared such that each thickness (tn) of the normal portions was set at 3 mm and that thickness ratios thereof to the thicknesses (tt) of the electrode portions were set in a range of 1.5 to 3. In Samples 22 to 24 in which the thicknesses of the electrode portions were 4.5 mm to 7.5 mm, the occurrence of a crack was not observed, and an effect of extending each lifetime was also obtained. However, in Sample 25 in which the thickness (tt) of the electrode portion was 9 mm, a crack occurred in the thick portion. Hence, it can be said that it is desirable to set the thickness of the electrode portion at 8 mm or less in order to at least prevent the crack from occurring.

Samples 26 to 29 were prepared such that each thickness (tn) of the normal portions was set at 4 mm and that thickness ratios thereof to the thicknesses (tt) of the electrode portions were set in a range of 1.5 to 3. When the thickness of the electrode portion was 8 mm or more, a crack occurred in the thick portion (electrode portion).

Samples 30 to 33 were prepared such that each thickness (tn) of the normal portions was set at 5 mm and that thickness ratios thereof to the thicknesses (tt) of the electrode portions were set in a range of 1.5 to 3. When the thickness of the electrode portion was 8 mm more, a crack occurred in the thick portion (electrode portion).

Samples 34 to 37 were prepared such that each thickness (tn) of the normal portions was set at 6 mm and that thickness ratios thereof to the thicknesses (tt) of the electrode portions were set in a range of 1.5 to 3. Cracks occurred in both of the normal portion and the thick portion (electrode portion).

Accordingly, it was confirmed that it was desirable that the thickness of the electrode portion be 8 mm or less and that the thickness of the normal portion be 5 mm or less in order to at least prevent the crack from occurring.

(Regarding Samples 38 to 57)

In each of Samples 38 to 57, a thickness of each portion was conditionally set under conditions where the ratio of the thickness (tn) of the normal portion to the thickness (tt) of the electrode portion was fixed to 3 and the thickness of the electrode portion was set at 6 mm or less. Moreover, areas of the coating layers were set in a range of $1\times10^6$ mm$^2$ to $1\times10^4$ mm$^2$.

In Samples 38 to 41, when an area of each coating layer was set at $1\times10^6$ mm$^2$, cracks occurred in Sample 40 in which the thickness of the electrode portion was 3 mm and Sample 41 in which the thickness of the electrode portion was 6 mm. From this result, it is understood that the crack becomes prone to occur when the area of the coating layer is widened. Accordingly, it can be said that, in order to prevent the cracks from occurring, it is preferable that at least the thickness of the electrode portion (thick portion) be 1.5 mm or less in a range where the area of the coating layer is $1\times10^6$ mm$^2$ or less.

In Samples 42 to 45, when an area of each coating layer was set at $5\times10^5$ mm$^2$, a crack occurred in Sample 45 in which the thickness of the electrode portion was 6 mm. Hence, it can be said that, in order to prevent the crack from occurring, it is preferable that at least the thickness of the electrode portion (thick portion) be 3 mm or less in a range where the area of the coating layer is $5\times10^5$ mm$^2$ or less.

When an area of each coating layer was set at $1\times10^5$ mm$^2$ in Samples 46 to 49 and an area of each coating layer was set at $\times10^4$ mm$^2$ in Samples 50 to 57, a crack in the coating layer did not occur. Note that, when consideration is made for this result in combination with the results in Samples 1 to 37 in which the area of each coating layer was set at $1\times10^4$ mm$^2$, it can be said that, in order to prevent the crack from occurring, it is preferable that at least the thickness of the electrode portion (thick portion) be 6 mm or less in the range where the area of the coating layer is $1\times10^4$ mm$^2$.

Although the ceramic member of the present invention has been described above along the embodiment and the examples, it is apparent that the present invention is not limited to descriptions of these embodiment and examples. It is apparent to those skilled in the art that various modifications and alterations are possible.

As described above, in the ceramic member of the present invention, the thick portion is formed locally on a part of the coating layer resistant to the halogen plasma, and accordingly, the crack can be prevented from occurring, and the lifetime of the member against the halogen plasma can be extended. Hence, an exchange frequency of the member is reduced, thus making it possible to lower maintenance cost of the plasma treatment apparatus and the like. Moreover, even in the case of using the materials resistant to the plasma, which are expensive, the thick portion is formed only on a limited region, and therefore, an increase in cost of the materials can be suppressed.

TABLE 1

| SAMPLE No | THICKNESS OF NORMAL PORTION (mm) | THICKNESS OF ELECTRODE PORTION (mm) | THICKNESS RATIO (—) | AREA (mm$^2$) | EXISTENCE OF CRACK |
|---|---|---|---|---|---|
| 1 | 0.2 | 0.2 | 1 | 10000 | NO CRACK |
| 2 | 0.2 | 0.3 | 1.5 | 10000 | NO CRACK |
| 3 | 0.2 | 0.4 | 2 | 10000 | NO CRACK |
| 4 | 0.2 | 0.5 | 2.5 | 10000 | NO CRACK |
| 5 | 0.2 | 0.6 | 3 | 10000 | NO CRACK |
| 6 | 0.2 | 0.6 | 3.5 | 10000 | NO CRACK |
| 7 | 0.2 | 0.7 | 4 | 10000 | NO CRACK |
| 8 | 0.2 | 0.8 | 4.5 | 10000 | NO CRACK |
| 9 | 0.2 | 0.9 | 5 | 10000 | NO CRACK |
| 10 | 0.5 | 0.75 | 1.5 | 10000 | NO CRACK |
| 11 | 0.5 | 1 | 2 | 10000 | NO CRACK |
| 12 | 0.5 | 1.25 | 2.5 | 10000 | NO CRACK |
| 13 | 0.5 | 1.5 | 3 | 10000 | NO CRACK |
| 14 | 1 | 1.5 | 1.5 | 10000 | NO CRACK |
| 15 | 1 | 2 | 2 | 10000 | NO CRACK |
| 16 | 1 | 2.5 | 2.5 | 10000 | NO CRACK |
| 17 | 1 | 3 | 3 | 10000 | NO CRACK |
| 18 | 2 | 3 | 1.5 | 10000 | NO CRACK |
| 19 | 2 | 4 | 2 | 10000 | NO CRACK |
| 20 | 2 | 5 | 2.5 | 10000 | NO CRACK |
| 21 | 2 | 6 | 3 | 10000 | NO CRACK |
| 22 | 3 | 4.5 | 1.5 | 10000 | NO CRACK |
| 23 | 3 | 6 | 2 | 10000 | NO CRACK |
| 24 | 3 | 7.5 | 2.5 | 10000 | NO CRACK |
| 25 | 3 | 9 | 3 | 10000 | CRACK OCCURRED |
| 26 | 4 | 6 | 1.5 | 10000 | NO CRACK |
| 27 | 4 | 8 | 2 | 10000 | CRACK OCCURRED |
| 28 | 4 | 10 | 2.5 | 10000 | CRACK OCCURRED |
| 29 | 4 | 12 | 3 | 10000 | CRACK OCCURRED |
| 30 | 5 | 7.5 | 1.5 | 10000 | NO CRACK |
| 31 | 5 | 10 | 2 | 10000 | CRACK OCCURRED |
| 32 | 5 | 12.5 | 2.5 | 10000 | CRACK OCCURRED |
| 33 | 5 | 15 | 3 | 10000 | CRACK OCCURRED |
| 34 | 6 | 9 | 1.5 | 10000 | CRACK OCCURRED |
| 35 | 6 | 12 | 2 | 10000 | CRACK OCCURRED |
| 36 | 6 | 15 | 2.5 | 10000 | CRACK OCCURRED |
| 37 | 6 | 18 | 3 | 10000 | CRACK OCCURRED |

TABLE 2

| SAMPLE No | ETCHED DEPTH OF NORMAL PORTION (μm/hr) | ETCHED DEPTH OF ELECTRODE PORTION (μm/hr) | LIFETIME OF NORMAL PORTION (hr) | LIFETIME OF ELECTRODE PORTION (hr) | OVERALL LIFETIME (hr) | LIFETIME EXTENSION RATE※1) |
|---|---|---|---|---|---|---|
| 1 | 0.03 | 0.09 | 6667 | 2222 | 2222 | 1.0 |
| 2 | 0.03 | 0.09 | 6667 | 3333 | 3333 | 1.5 |
| 3 | 0.03 | 0.09 | 6667 | 4444 | 4444 | 2.0 |
| 4 | 0.03 | 0.09 | 6667 | 5556 | 5556 | 2.5 |
| 5 | 0.03 | 0.09 | 6667 | 6667 | 6667 | 3.0 |
| 6 | 0.03 | 0.09 | 6667 | 6667 | 6667 | 3.0 |
| 7 | 0.03 | 0.09 | 6667 | 7778 | 6667 | 3.0 |
| 8 | 0.03 | 0.09 | 6667 | 8889 | 6667 | 3.0 |
| 9 | 0.03 | 0.09 | 6667 | 10000 | 6667 | 3.0 |
| 10 | 0.03 | 0.09 | 16667 | 8333 | 8333 | 3.8 |
| 11 | 0.03 | 0.09 | 16667 | 11111 | 11111 | 5.0 |
| 12 | 0.03 | 0.09 | 16667 | 13889 | 13889 | 6.3 |
| 13 | 0.03 | 0.09 | 16667 | 16667 | 16667 | 7.5 |
| 14 | 0.03 | 0.09 | 33333 | 16667 | 16667 | 7.5 |
| 15 | 0.03 | 0.09 | 33333 | 22222 | 22222 | 10.0 |
| 16 | 0.03 | 0.09 | 33333 | 27778 | 27778 | 12.5 |
| 17 | 0.03 | 0.09 | 33333 | 33333 | 33333 | 15.0 |
| 18 | 0.03 | 0.09 | 66667 | 33333 | 33333 | 15.0 |
| 19 | 0.03 | 0.09 | 66667 | 44444 | 44444 | 20.0 |
| 20 | 0.03 | 0.09 | 66667 | 55556 | 55556 | 25.0 |
| 21 | 0.03 | 0.09 | 66667 | 66667 | 66667 | 30.0 |
| 22 | 0.03 | 0.09 | 100000 | 50000 | 50000 | 22.5 |
| 23 | 0.03 | 0.09 | 100000 | 66667 | 66667 | 30.0 |
| 24 | 0.03 | 0.09 | 100000 | 83333 | 83333 | 37.5 |
| 25 | 0.03 | 0.09 | 100000 | 100000 | 100000 | — |
| 26 | 0.03 | 0.09 | 133333 | 66667 | 66667 | 30.0 |
| 27 | 0.03 | 0.09 | 133333 | 88889 | 88889 | — |
| 28 | 0.03 | 0.09 | 133333 | 111111 | 111111 | — |
| 29 | 0.03 | 0.09 | 133333 | 133333 | 133333 | — |
| 30 | 0.03 | 0.09 | 166667 | 83333 | 83333 | 37.5 |
| 31 | 0.03 | 0.09 | 166667 | 111111 | 111111 | — |
| 32 | 0.03 | 0.09 | 166667 | 138889 | 138889 | — |
| 33 | 0.03 | 0.09 | 166667 | 166667 | 166667 | — |
| 34 | 0.03 | 0.09 | 200000 | 100000 | 100000 | — |
| 35 | 0.03 | 0.09 | 200000 | 133333 | 133333 | — |
| 36 | 0.03 | 0.09 | 200000 | 166667 | 166667 | — |
| 37 | 0.03 | 0.09 | 200000 | 200000 | 200000 | — |

※1)ASSUMPTION: AN OVERALL LIFETIME OF SAMPLE 1 IS STANDARD.

TABLE 3

| SAMPLE No | THICKNESS OF NORMAL PORTION (mm) | THICKNESS OF ELECTRODE PORTION (mm) | THICKNESS RATIO (—) | AREA (mm$^2$) | EXISTENCE OF CRACK |
|---|---|---|---|---|---|
| 38 | 0.1 | 0.3 | 3 | 100000 | NO CRACK |
| 39 | 0.5 | 1.5 | 3 | 100000 | NO CRACK |
| 40 | 1 | 3 | 3 | 100000 | CRACK OCCURRED |
| 41 | 2 | 6 | 3 | 100000 | CRACK OCCURRED |
| 42 | 0.1 | 0.3 | 3 | 500000 | NO CRACK |
| 43 | 0.5 | 1.5 | 3 | 500000 | NO CRACK |
| 44 | 1 | 3 | 3 | 500000 | NO CRACK |
| 45 | 2 | 6 | 3 | 500000 | CRACK OCCURRED |
| 46 | 0.1 | 0.3 | 3 | 100000 | NO CRACK |
| 47 | 0.5 | 1.5 | 3 | 100000 | NO CRACK |
| 48 | 1 | 3 | 3 | 100000 | NO CRACK |
| 49 | 2 | 6 | 3 | 100000 | NO CRACK |
| 50 | 0.1 | 0.3 | 3 | 50000 | NO CRACK |
| 51 | 0.5 | 1.5 | 3 | 50000 | NO CRACK |
| 52 | 1 | 3 | 3 | 50000 | NO CRACK |
| 53 | 2 | 6 | 3 | 50000 | NO CRACK |
| 54 | 0.1 | 0.3 | 3 | 10000 | NO CRACK |
| 55 | 0.5 | 1.5 | 3 | 10000 | NO CRACK |
| 56 | 1 | 3 | 3 | 10000 | NO CRACK |
| 57 | 2 | 6 | 3 | 10000 | NO CRACK |

TABLE 4

| SAMPLE No | ETCHED DEPTH OF NORMAL PORTION (μm/hr) | ETCHED DEPTH OF ELECTRODE PORTION (μm/hr) | LIFETIME OF NORMAL PORTION (hr) | LIFETIME OF ELECTRODE PORTION (hr) | OVERALL LIFETIME (hr) | LIFETIME EXTENSION RATE(※1) |
|---|---|---|---|---|---|---|
| 38 | 0.03 | 0.09 | 3333 | 3333 | 3333 | 1.5 |
| 39 | 0.03 | 0.09 | 16667 | 16667 | 16667 | 7.5 |
| 40 | 0.03 | 0.09 | 33333 | 33333 | 33333 | — |
| 41 | 0.03 | 0.09 | 66667 | 66667 | 66667 | — |
| 42 | 0.03 | 0.09 | 3333 | 3333 | 3333 | 1.5 |
| 43 | 0.03 | 0.09 | 16667 | 16667 | 16667 | 7.5 |
| 44 | 0.03 | 0.09 | 33333 | 33333 | 33333 | 15.0 |
| 45 | 0.03 | 0.09 | 66667 | 66667 | 66667 | — |
| 46 | 0.03 | 0.09 | 3333 | 3333 | 3333 | 1.5 |
| 47 | 0.03 | 0.09 | 16667 | 16667 | 16667 | 7.5 |
| 48 | 0.03 | 0.09 | 33333 | 33333 | 33333 | 15.0 |
| 49 | 0.03 | 0.09 | 66667 | 66667 | 66667 | 30.0 |
| 50 | 0.03 | 0.09 | 3333 | 3333 | 3333 | 1.5 |
| 51 | 0.03 | 0.09 | 16667 | 16667 | 16667 | 7.5 |
| 52 | 0.03 | 0.09 | 33333 | 33333 | 33333 | 15.0 |
| 53 | 0.03 | 0.09 | 66667 | 66667 | 66667 | 30.0 |
| 54 | 0.03 | 0.09 | 3333 | 3333 | 3333 | 1.5 |
| 55 | 0.03 | 0.09 | 16667 | 16667 | 16667 | 7.5 |
| 56 | 0.03 | 0.09 | 33333 | 33333 | 33333 | 15.0 |
| 57 | 0.03 | 0.09 | 66667 | 66667 | 66667 | 30.0 |

※1)ASSUMPTION: AN OVERALL LIFETIME OF SAMPLE 1 IS STANDARD.

What is claimed is:

1. A ceramic member being usable in a state where at least a part thereof is exposed in a reactor in which halogen plasma is generated, comprising:
    a base member containing a first ceramic material as a main component; and
    a coating layer on a surface of the base member, said surface being adapted to face an inside of a reactor, the coating layer containing a second ceramic material more resistant to plasma etching than the first ceramic material as a main component,
    wherein the coating layer includes a thick portion in a region where an etching rate of the coating layer by the halogen plasma is locally high, and a thickness (tt) of the thick portion and a thickness (tn) of a normal thickness portion other than the thick portion satisfy the following expression (1):

$$tn < tt \leq (Ee/En) \times tn \quad (1)$$

where
    En: etching rate of the coating layer in the normal thickness portion; and
    Ee: etching rate of the coating layer in the thick portion.

2. The ceramic member according to claim 1, wherein the thickness (tt) of the thick portion is 8 mm or less, and the thickness (tn) of the normal thickness portion is 5 mm or less.

3. The ceramic member according to claim 1, wherein a surface area of the coating layer is $1 \times 10^6$ mm$^2$ or less, and the thickness (tt) of the thick portion is 1.5 mm or less.

4. The ceramic member according to claim 1, wherein a surface area of the coating layer is $5 \times 10^5$ mm$^2$ or less, and the thickness (tt) of the thick portion is 3 mm or less.

5. The ceramic member according to claim 1, wherein a surface area of the coating layer is $1 \times 10^5$ mm$^2$ or less, and the thickness (tt) of the thick portion is 6 mm or less.

6. The ceramic member according to claim 1, wherein the first ceramic material is alumina.

7. The ceramic member according to claim 1, wherein the second ceramic material is any of yttria and a composite oxide containing yttria and aluminum.

8. The ceramic member according to claim 1, wherein the first ceramic material is at least one material selected from the group consisting of silicon nitride, aluminum nitride and silicon carbide.

9. The ceramic member according to claim 1, wherein the second ceramic material is diamond.

10. The ceramic member according to claim 1, wherein the second ceramic material is alkaline-earth fluoride.

11. The ceramic member according to claim 1, wherein the ceramic member is a member composing an inner wall of the reactor of plasma treatment apparatus.

12. The ceramic member according to claim 1, wherein the thick portion is formed on the coating layer close to a position where an electrode for generating the plasma is disposed.

13. The ceramic member according to claim 1, wherein the base member has a substantially even thickness.

14. The ceramic member according to claim 1, wherein the base member locally includes a concave portion on the surface where the coating layer is formed, and the thick portion of the coating layer is formed to coat the concave portion.

15. The ceramic member according to claim 1, wherein the coating layer is one formed by use of a plasma flame spraying method.

16. The ceramic member according to claim 1, wherein the base member and the coating layer are an integrally sintered body formed by use of a gel casting method and then fired integrally.

17. A ceramic member being usable in a state where at least a part thereof is exposed in a reactor in which halogen plasma is generated, comprising:
    a base member containing a first ceramic material as a main component; and a coating layer on a surface of the base member, said surface being adapted to face an inside of a reactor, the coating layer containing a second ceramic material more resistant to plasma etching than the first ceramic material as a main component, wherein the coating layer locally includes a thick portion, and a thickness (tt) of the thick portion and a thickness (tn) of a normal thickness portion other than the thick portion satisfy the following expression (2):

$$tn < tt \leq 3 \times tn \quad (2).$$

18. An apparatus comprising:

a reactor adapted to contain a halogen plasma; and a ceramic member comprising a base member containing a first ceramic material as a main component and a coating layer on a surface of said base member, said coating layer containing a second ceramic material more resistant to plasma etching than the first ceramic material as a main component, wherein said ceramic member is associated with said reactor such that at least said coating layer is exposed to an inside of said reactor, and wherein said coating layer includes a thick portion in a region where an etching rate of said coating layer by the halogen plasma is locally high, and a thickness (tt) of the thick portion and a thickness (tn) of a normal thickness portion other than the thick portion satisfy the following expression (1):

$$tn < tt \leq (Ee/En) \times tn \quad (1)$$

where

En: etching rate of the coating layer in the normal thickness portion; and

Ee: etching rate of the coating layer in the thick portion.

19. An apparatus comprising:

a reactor adapted to contain a halogen plasma; and a ceramic member comprising a base member containing a first ceramic material as a main component and a coating layer on a surface of said base member, said coating layer containing a second ceramic material more resistant to plasma etching than the first ceramic material as a main component, wherein said ceramic member is associated with said reactor such that at least said coating layer is exposed to an inside of said reactor, and wherein said coating layer locally includes a thick portion, and a thickness (tt) of the thick portion and a thickness (tn) of a normal thickness portion other tan the thick portion satisfy the following expression (2):

$$tn < tt \leq 3 \times tn \quad (2).$$

* * * * *

UNITED STATES PATENT AND TRADEMARK OFFICE
CERTIFICATE OF CORRECTION

PATENT NO. : 7,083,846 B2 Page 1 of 1
APPLICATION NO. : 10/796799
DATED : August 1, 2006
INVENTOR(S) : Hirotake Yamada It is certified that error appears in the above-identified patent and that said Letters Patent is hereby corrected as shown below:

Column 18
  *Line 22*: please change "tan" to --than--

Signed and Sealed this

Twenty-first Day of November, 2006

JON W. DUDAS
*Director of the United States Patent and Trademark Office*